United States Patent [19]

Schnable

[11] Patent Number: 4,582,745
[45] Date of Patent: Apr. 15, 1986

[54] DIELECTRIC LAYERS IN MULTILAYER REFRACTORY METALLIZATION STRUCTURE

[75] Inventor: George L. Schnable, Montgomery County, Pa.

[73] Assignee: RCA Corporation, Princeton, N.J.

[21] Appl. No.: 571,423

[22] Filed: Jan. 17, 1984

[51] Int. Cl.[4] .......................... B32B 3/00; B32B 7/00; B32B 15/00; B32B 13/00
[52] U.S. Cl. .................................... 428/209; 428/210; 428/901; 428/701; 428/427; 428/428
[58] Field of Search .............. 428/209, 210, 427, 428, 428/701, 901

[56] References Cited

U.S. PATENT DOCUMENTS

| | | | |
|---|---|---|---|
| 3,475,210 | 10/1969 | Lehrer | 428/427 |
| 4,110,487 | 8/1978 | Rion | 428/428 X |
| 4,349,584 | 9/1982 | Flatley et al. | 427/89 |
| 4,363,830 | 12/1982 | Hsu et al. | 427/88 |
| 4,369,220 | 1/1983 | Probhu et al. | 428/209 |
| 4,424,251 | 1/1984 | Sugishita et al. | 428/427 X |

OTHER PUBLICATIONS

Kern et al., RCA Review, vol. 43, Sep. 1982, pp. 423–457.
Barr et al., Scientific and Industrial Glass Blowing and Laboratory Techniques, Instruments Publishing Co., 1949, pp. 20–22.

*Primary Examiner*—George F. Lesmes
*Assistant Examiner*—Nancy A. B. Swisher
*Attorney, Agent, or Firm*—Birgit E. Morris; R. Hain Swope

[57] ABSTRACT

Multilevel metallization structures in semiconductor devices are improved by utilizing a two- or three-layer dielectric system wherein the dielectric layers differ in flow temperature by at least 50° and preferably 100° C., so that one layer may be flowed without reflow or mutual dissolution with an underlying contacting dielectric layer. The first dielectric layer is phosphosilicate glass and the second is borophosphosilicate glass. A third layer is also borophosphosilicate glass differing in composition from the second so as to provide the required flow temperature differential.

7 Claims, No Drawings

DIELECTRIC LAYERS IN MULTILAYER REFRACTORY METALLIZATION STRUCTURE

This invention relates to the use of specific glass compositions as dielectric layers in multilayer refractory metallization structures for electronic device application.

BACKGROUND OF THE INVENTION

Multilevel metallization systems are becoming common in the electronics industry to reduce the space required for metal interconnections. In such systems, a first metal layer is deposited on a suitable substrate and defined. A layer of dielectric material is deposited thereover and vias are formed therein, thus exposing a portion of the first metal layer and/or the substrate. A second layer of metal is deposited thereover and defined to form the remaining portion of the interconnection system. A final layer of dielectric material is deposited thereover to insulate and protect the system.

Typically, substrates to be coated with multilevel metallization have uneven topography, e.g device structures or epitaxial silicon islands on their surfaces. It is therefore generally preferred to deposit a planarizing layer prior to deposition of the first metal layer, so that the layer of resist material which is used to define the metal layer may itself be patterned with utmost accuracy. This becomes more important as line widths drop to one micrometer or less. It is therefore advantageous that the dielectric materials have good planarizing properties.

Certain glasses, i.e., silicon dioxide and phosphosilicate glass (PSG) are conventional in the electronics industry for dielectric insulation between patterned layers of refractory metallization, i.e. refractory conductors. Borophosphosilicate glass (BPSG) is an unexpectedly superior dielectric material in such systems as disclosed in copending application Ser. No. 526,623, filed Aug. 26, 1983, the disclosure of which is incorporated herein by reference. In addition to other desireable properties, phosphosilicate glass and borophosphosilicate glass can be heated to flow or reflow them in order to obtain a smooth surface topography. It is necessary, however, when a structure contains a plurality of such dielectric materials that flowing a given layer does not cause remelting of previously deposited layers. A system of dielectric glass compositions which meets this criteria and which, unexpectedly, remains stable against mutual flow and dissolution is provided herein.

SUMMARY OF THE INVENTION

A tandem flowable system of dielectric layers in a multilevel refractory conductor structure is provided which comprises a first flowable layer of phosphosilicate glass (PSG) and a second flowable layer of borophosphosilicate glass (BPSG). A trilayer system comprises PSG and two layers of BPSG having sufficient variation in boron and/or phosphorus content to provide a difference in flow temperature of at least about 50° C., preferably at least about 100° C.

DETAILED DESCRIPTION OF THE INVENTION

The substrate for the multilevel structure of this invention may be of any conventional material, for example, single crystalline silicon, gallium arsenide, polycrystalline materials with suitable surfaces, vitreous materials, or the like. The substrate may have devices on, or partially on, its surface, or buried therein. The substrate may be coated with a conventional layer of gate oxide or a layer of planarizing material.

The present invention encompasses both a two- and a three-layer tandem flow dielectric system. The first dielectric layer of the subject system may be on the substrate or between the patterned refractory conductor layers, depending on whether two or three dielectric layers are utilized. The three-layer system will be described herein.

The first layer of the dielectric system of this invention is a layer of phosphosilicate glass containing from about 5.5 to 6.5, preferably about 6, percent by weight of phosphorus. The thickness of this layer is suitably from about 0.8 to 1.2 times the height of the highest step on the substrate. Generally, the first dielectric layer is from about 0.5 micrometer to about 0.8 micrometer, preferably about 0.6 micrometer thick.

The glass dielectric layers of this invention, are preferably deposited by chemical vapor deposition. Conventionally, chemical vapor deposition (CVD) of PSG is carried out by gas oxidation of a mixture of the hydrides of the constituents, i.e. silane and phosphine, with a suitable inert diluent, e.g. nitrogen. Oxygen is the preferred oxidant, although other gases such as nitric oxide or nitrous oxide may be utilized as well. Conventional variations of CVD which also may be utilized include atmospheric pressure CVD (APCVD), low pressure CVD (LPCVD), plasma enhanced low pressure CVD (PE/LPCVD), and the like.

Chemical vapor desposition of PSG is suitably carried out at a temperature of from about 350° C. to about 450° C., preferably about 420° C. These temperatures may vary depending on the deposition technique utilized. The glass layer is then flowed at about 1100° C. for 30 minutes to improve planarization. A patterned layer of resist material is then formed on the PSG layer, and the exposed portion of the PSG layer etched away to form vias to the underlying substrate.

A layer of a refractory conductor is deposited over the patterned PSG layer to contact the underlying substrate through the vias therein. "Refractory conductor", in the context of this invention, indicates a refractory metal such as tungsten or molybdenum, a refractory metal silicide such as molybdenum or tantalum silicide, nonmetal refractory conductors such as doped polycrystalline silicon, and the like. The glass dielectric compositions of this invention are utilized only with such refractory conductors. The layers of refractory conductor is deposited by conventional techniques such as CVD or sputtering.

The layer of refractory metal is generally from about 0.2 to 0.8 micrometer thick. This may vary depending on the requirements of the structure, or composition of the layer itself. After deposition and any subsequent treatment such as doping, the layer is patterned by conventional procedures.

A layer of borophosphosilicate glass (BPSG) is then deposited over the patterned conductive layer suitably by the same techniques as was the first layer, i.e. CVD, LPCVD, and the like. In a two-layer dielectric system as contemplated herein, the layer of BPSG contains from about 3 to about 6, preferably from about 4 to 5, weight percent of boron, and from about 2 to about 6, preferably from about 3 to 5, weight percent of phosphorus. In the three-layer dielectric system of this invention, the second layer contains from about 4 to 4.5 weight percent of boron and from about 3.5 to 4 weight percent of phosphorus. This material is referred to in copending application Ser. No. 526,623 as Type A BPSG.

The BPSG layer is suitably from about 0.8 to 1.4 times as thick as the patterned refractory conductor layer to provide sufficient planarization for the second layer of refractory conductor. The second dielectric layer is generally between about 0.6 to 1.0 micrometer thick. The use of BPSG as the second flowable dielectric layer in the system of this invention is advantageous in that the difference in optical spectra caused by the presence of boron provides convenient endpoint detection in the plasma etching of the second layer where it contacts the PSG layer. The second dielectric layer is flowed at about 950° C. At this temperature, no reflow of the first layer occurs.

It has been found by chemical etching and subsequent microscopic examination that there is no significant flow or mutual dissolution between the first and second dielectric layers in spite of the extensive contact between them. This is considered unexpected in view of their similarity and the fact that, in general, glasses by definition are liquids even at room temperature. After flow, the second dielectric layer is covered with a patterned layer of resist material and etched by conventional wet or dry techniques to open vias therein. Some of the vias may extend to the substrate while others will extend to the underlying patterned layer of refractory metal.

A second layer of refractory metal is then deposited thereover, making contact with the first such layer or with devices in the substrate through the vias. Although the composition of the second refractory metal layer is preferably the same as the first layer, it may be of any refractory conductor. Deposition of the second layer of refractory conductor, as well as defining it to produce the desired circuit pattern, are carried out by conventional techniques.

Finally, the third layer of dielectric material is deposited over the defined second layer of refractory conductor to provide a flowable surface layer. This layer is referred to in copending application Ser. No. 526,623 as Type B BPSG and contains from about 4.5 to 5 weight percent of boron and from about 4 to 4.5 weight percent of phosphorus. This layer is flowed at about 850° C. to planarize the second refractory conductor layer. The third dielectric layer preferably should be from about 0.8 to 1.4 times the thickness of the second refractory metal layer. Generally, the third dielectric layer is from about 0.6 to about 1.2 micrometer thick. It will be appreciated that, in the event the first dielectric layer in the subject structures is between the first and second refractory conductors layers, the second dielectric layer overlies the structure and may be either Type A or Type B BPSG.

In flowing the third dielectric layer at 850° C., there is no reflow of either the first or second dielectric layers and, in spite of the extensive contact between the second and third dielectric layers, there is no significant interdissolution or influencing of properties between them. This is considered unexpected, for example, in view of the closely parallel process of tandem soldering wherein two layers of solder have to be separated by a physical barrier due to interreaction when the second is being melted.

The invention has been described with reference to preferred embodiments thereof. It will be appreciated by those skilled in the art that various modifications may be made from the specific details given without departing from the spirit and scope of the invention.

I claim:

1. In a multilayer structure on a substrate consisting, in part, of two patterned layers of refractory conductor material separated by a first layer of dielectric material but contacting through openings in said first dielectric layer, said layers having thereover a second layer of dielectric material, the improvement wherein the first layer of dielectric material is a phosphosilicate glass and the second layer of dielectric material is a borophosphosilicate glass, and the difference in flow temperature between said dielectric layers is at least about 50° C., wherein said phosphosilicate glass contains from about 5.5 to about 6.5 percent by weight of phosphorus and said borophosphosilicate glass contains from about 3 to about 6 percent by weight of boron and from about 2 to about 6 percent by weight of phosphorus.

2. An improved structure in accordance with claim 1, wherein said phosphosilicate glass layer contains about 6 percent by weight of phosphorus.

3. An improved structure in accordance with claim 1, wherein the difference in flow temperature between the first and second dielectric layers is at least about 100° C.

4. In a multilevel structure on a substrate consisting, in part, of a first dielectric layer overlying the substrate, two patterned layers of refractory conductor separated by a second layer of dielectric material, wherein at least one of the refractory conductor layers contacts the substrate through openings in the first dielectric layer and the refractory metal layers contact through openings in the second dielectric layer, said layers having thereover a third layer of dielectric material, the improvement wherein the first layer of dielectric material is a phosphosilicate glass, the second layer of dielectric material is a borophosphosilicate glass having a flow temperature at least about 50° C. lower than that of the first dielectric layer, and the third dielectric layer is a borophosphosilicate glass having a flow temperature at least about 50° C. lower than that of the second dielectric layer, wherein said phosphosilicate glass contains from about 5.5 to about 6.5 percent by weight of phosphorus and said borophosphosilicate glass contains from about 3 to about 6 percent by weight of boron and from about 2 to about 6 percent by weight of phosphorus.

5. An improved structure in accordance with claim 4, wherein the difference in flow temperature between the dielectric layers is at least about 100° C.

6. An improved structure in accordance with claim 4, wherein the first layer of dielectric material contains about 6.0 percent by weight of phosphorus.

7. An improved structure in accordance with claim 4, wherein the second layer of dielectric contains from about 4 to about 4.5 percent by weight of boron and from about 3.5 to about 4 percent by weight of phosphorus, and the third dielectric layer contains from about 4.5 to about 5 percent by weight of boron and from about 4.5 to about 5 percent by weight of phosphorus.

* * * * *